US012416656B2

(12) United States Patent
Ruster et al.

(10) Patent No.: US 12,416,656 B2
(45) Date of Patent: Sep. 16, 2025

(54) SENSOR SYSTEM AND METHOD FOR ANALYZING A SPECTRUM OF AN EM SIGNAL

(71) Applicants: Rohde & Schwarz GmbH & Co. KG, Munich (DE); University Of Basel, Basel (CH)

(72) Inventors: Thomas Ruster, Munich (DE); Melvyn Ho, Munich (DE); Philipp Treutlein, Basel (CH); Yongqi Shi, Basel (CH)

(73) Assignees: Rohde & Schwarz GmbH & Co. KG, Munich (DE); University Of Basel, Basel (CH)

( * ) Notice: Subject to any disclaimer, the term of this patent is extended or adjusted under 35 U.S.C. 154(b) by 170 days.

(21) Appl. No.: 18/362,084

(22) Filed: Jul. 31, 2023

(65) Prior Publication Data

US 2025/0044333 A1 Feb. 6, 2025

(51) Int. Cl.
*G01R 29/08* (2006.01)

(52) U.S. Cl.
CPC ..... *G01R 29/0878* (2013.01); *G01R 29/0892* (2013.01)

(58) Field of Classification Search
CPC ............ G01R 29/0878; G01R 29/0892; G01R 23/17; G01R 29/0885
USPC .......................................................... 324/457
See application file for complete search history.

(56) References Cited

U.S. PATENT DOCUMENTS 8,405,021 B2 * 3/2013 Anderson .............. G21K 1/006 250/436
8,415,612 B2 * 4/2013 McBride ................ G21K 1/093 250/436
2015/0048824 A1 * 2/2015 Bohi .................... G01R 33/323 324/309
2016/0363617 A1 * 12/2016 Anderson .......... G01R 29/0885
2019/0187198 A1 * 6/2019 Anderson .......... G01R 29/0878
2022/0196716 A1 * 6/2022 Anderson .............. G01R 29/10
2023/0137266 A1 * 5/2023 McBride ............ G01R 29/0878 250/389

OTHER PUBLICATIONS

Liu, Xiaochi, et al. "Microwave magnetic field detection based on Cs vapor cell in free space." Review of Scientific Instruments 89.6 (2018). (Year: 2018).*

(Continued)

*Primary Examiner* — Christopher P McAndrew
(74) *Attorney, Agent, or Firm* — Studebaker Brackett PLLC

(57) ABSTRACT

The present disclosure relates to a sensor system for analyzing a spectrum of an electromagnetic, EM, signal. The system includes a vapor cell containing at least one species of atoms in a gaseous form, wherein the atoms in the vapor cell are exposed to the EM signal; at least one excitation source excites a number of atoms in the vapor cell to a Rydberg state, wherein at least a fraction of the excited atoms are ionized; a number of electrode pairs which are arranged along the vapor cell, and which generate a spatially and/or temporally varying electric field in the vapor cell; a current sense circuit detects a current between at least one of the number of electrode pairs, wherein the current is caused by ionized atoms in the vapor cell; and a processor determines spectral information of the EM signal based on the detected current.

15 Claims, 7 Drawing Sheets

100
109
103
102
101
101
103
104
105

(56) References Cited

OTHER PUBLICATIONS

European Search report for EP 24182742. (Year: 2024).*

Barredo, D. et al., Electrical read out for coherent phenomena involving Rydberg atoms in thermal vapor cells, Atomic Physics, Sep. 11, 2018, pp. 1-4.

* cited by examiner

SENSOR SYSTEM AND METHOD FOR ANALYZING A SPECTRUM OF AN EM SIGNAL

TECHNICAL FIELD

The disclosure relates to sensor systems, in particular quantum sensor systems, for analyzing a spectrum of an electromagnetic (EM) signal and to a corresponding method.

BACKGROUND ART

Within the last years, there has been a lot of interest in sensing electromagnetic (EM) radiation with quantum systems. The most common quantum systems include ground-state atoms, excited atoms (especially to Rydberg states), or atom-like systems such as NV defects in diamonds. For instance, a quantum sensor which employs such a quantum system can detect EM radiation by resonant transitions between two energy states in the quantum system.

Another common technique of sensing EM radiation with a quantum system is by detecting an emission of fluorescence light. This light is emitted by the quantum particles after certain transitions and/or certain interactions with the EM radiation have occurred.

However, current state-of-the-art realizations of quantum sensors still lack sensitivity compared to traditional receivers. Furthermore, it is difficult to measure the spectrum of an EM signal over a broad spectral range with such a quantum sensor.

SUMMARY

Thus, there is a need to provide an improved sensor system and an improved method for analyzing a spectrum of an EM signal which avoid the above-mentioned disadvantages.

These and other objectives are achieved by the embodiments provided in the enclosed independent claims. Advantageous implementations of the present disclosure are further defined in the dependent claims.

According to a first aspect, the present disclosure relates to a sensor system for analyzing a spectrum of an EM signal. The sensor system comprises: a vapor cell containing at least one species of atoms in a gaseous form, wherein the atoms in the vapor cell are exposed to the EM signal; at least one excitation source configured to excite a number of atoms in the vapor cell to a Rydberg state, wherein at least a fraction of the excited atoms are ionized; an electric and/or magnetic field generator configured to generate a spatially and/or temporally varying electric and/or magnetic field in the vapor cell; a number of electrode pairs which are arranged along the vapor cell, and which are configured to apply an electric field to the atoms in the vapor cell; a current sense circuit configured to detect a current between at least one of the number of electrode pairs, wherein the current is caused by ionized atoms in the vapor cell; and a processor configured to determine spectral information of the EM signal based on the detected current.

This achieves the advantage that a sensor system is provided which allows to measure the spectrum of an EM signal with high sensitivity and over a broad spectral range.

The sensor system can be a quantum sensor system which is based on an excitation of quantum states, in particular Rydberg states, of atoms to sense the EM signal. For instance, the sensor system forms a quantum broadband receiver.

The EM signal can be a radio frequency (RF) or a microwave (MW) signal. The EM signal can also be an optical signal. The atoms in the vapor cell being exposed to the EM signal may refer to the fact that at least a part of the energy of the EM signal is present in or propagates through the vapor cell and can thereby affect the atoms in the vapor cell.

In particular, the vapor cell containing the atoms in gaseous form means that the vapor cell is filled with the atoms (i.e., with a gas which is formed from the atoms). However, this does not exclude that additional atom species/gases may be present in the vapor cell.

The at least one species of atoms can comprises Rubidium and/or Cesium atoms.

Each electrode pair can be configured to apply a static electric field to the atoms in the vapor cell. Thereby, the electric field generated by an electrode pair can differ by a certain value from the electric field generated by an adjacent electrode pair. In this way, the electrode pairs can create an electric field gradient within the vapor cell.

Alternatively, the electrode pairs can be configured to apply a uniform electric field to the atoms in the vapor cell. In this case, the electric and/or magnetic field generator can be configured to generate a magnetic field gradient and/or an additional varying electric field in the vapor cell.

For instance, one or both electrodes of each electrode pair can be arranged in the atomic vapor cell. A respective static voltage can be applied to each electrode pair to generate the electric field.

The at least one excitation source can comprise a frequency selective excitation source which is configured to excite atoms in the vapor cell to a resonant state, in particular, to a first Rydberg state. The at least one excitation source can transmit at least one excitation signal (e.g., a laser signal) into the vapor cell.

The electric and/or magnetic fields applied to the atoms in the vapor cell can shift the resonant frequencies of the resonant states to a different value. Furthermore, atoms that are excited by the excitation source to the first Rydberg level or state are often ionized by collisions with other atoms in the vapor cell. The electric field applied to the electrodes accelerates the charged particles (i.e., the negatively charged electron and the positively charged ion) towards the electrodes. This leads to a current that can be detected by the current sense circuit. For example, a minimum voltage may be required to accelerate the ionized atoms and achieve a detectable current.

In regions of the vapor cell where the EM signal frequency is (near-) resonant to a transition between the first Rydberg state and a second Rydberg state of the excited atoms, the energy level structure of the atoms is changed by the EM signal. For instance, the first Rydberg state is moved out of resonance with an excitation signal of the resonant source(s), thus reducing the Rydberg excitation probability in this region of the cell. This can be detected via a reduction of the current between a particular pair of electrodes.

The processor can then correlate the detected change of the current to the electric and/or magnetic field applied at the respective location in the cell, and can derive information on the spectrum of the EM signal from this correlation.

In an implementation form of the first aspect, the electric and/or magnetic field generator is configured to control the number of electrode pairs to generate a spatially and/or temporarily varying electric field in the vapor cell.

Thus, the varying electric field can be generated by the electrode pairs which are also used for readout. Optionally, an additional varying magnetic field could be applied to the vapor cell.

However, it also possible to apply a static electric field and a varying magnetic field to the atoms in the vapor cell. In this case, the spatially and/or temporally varying magnetic field can induce the change of the resonant frequency of the atoms in the vapor cell.

In an implementation form of the first aspect, the sensor system further comprises an element configured to transmit and/or guide at least a part of the EM signal into the vapor cell.

For instance, the element is a waveguide or an antenna.

In an implementation form of the first aspect, the sensor system further comprises a heating element configured to heat the atoms in the vapor cell to a determined temperature. For example, the temperature influences the energy levels of atoms in the vapor cell and can be used to influence the number of atoms that are ionized by collisions with other atoms.

In an implementation form of the first aspect, the at least one excitation source comprises two or more lasers which are configured to irradiate the vapor cell with light beams of different wavelengths and/or directions.

For example, the two lasers can be adjusted to be resonant with one particular transition of a species of atoms in the vapor cell to a first Rydberg state. The two light beams can be counter-propagating in the vapor cell.

In an implementation form of the first aspect, the at least one excitation source comprises an optical element which is configured to generate an array of light beams, wherein the light beams of the array of light beams are shifted in frequency and/or position.

In an implementation form of the first aspect, the sensor system comprises a detector configured to detect a fluorescence light emitted by the excited atoms in the vapor cell and/or an excitation signal of the at least one excitation source after transmitting through the vapor cell; wherein the processor is configured to determine the spectral information of the EM signal further based on a characteristic of the detected fluorescence light and/or the detected excitation signal.

In an implementation form of the first aspect, the vapor cell further contains a buffer gas which increases an ionization rate of the fraction of excited atoms in the vapor cell due to collisions of the atoms of the buffer gas with the excited atoms.

This achieves the advantage that the number of ionized atoms in the vapor cell and, thus, the detected current(s) can be increased and/or regulated.

In an implementation form of the first aspect, the current sense circuit is configured to determine a current profile based on currents detected between a plurality of the number of electrode pairs along the vapor cell; wherein the processor is configured to determine the spectral information based on the current profile.

For instance, the processor can be configured to determine the spectral information by comparing the current profile to a reference current profile which was measured without an EM signal. The reference current profile can be stored in a memory of the sensor system.

In an implementation form of the first aspect, the number of electrode pairs are configured to apply a uniform electric field to the atoms in the vapor cell. For instance, in this case a varying magnetic field can be applied to the atoms in the vapor cell in the form of a magnetic field gradient.

According to a second aspect, the present disclosure relates to a sensor system for analyzing a spectrum of an electromagnetic, EM, signal. The sensor system comprises: a vapor cell containing at least one species of atoms in a gaseous form, wherein the atoms in the vapor cell are exposed to the EM signal; at least one excitation source configured to excite a number of atoms in the vapor cell to a Rydberg state, wherein at least a fraction of the excited atoms are ionized; a signal generator configured to generate a microwave signal with a spatially and/or temporally varying signal strength and/or frequency in the vapor cell; a number of electrode pairs which are arranged along the vapor cell, and which are configured to apply an electric field to the atoms in the vapor cell; a current sense circuit configured to detect a current between at least one of the number of electrode pairs, wherein the current is caused by ionized atoms in the vapor cell; and a processor configured to determine spectral information of the EM signal based on the detected current.

This achieves the advantage that the resonant frequencies of the atoms in the vapor cell can be shifted by a microwave signal, while the electrode pairs are used for read out, i.e. for measuring a current generated by ionization depending on a magnetic field at a certain location or time. Thus, an alternative way of frequency tuning of the Rydberg resonances can be provided.

In an implementation form of the second aspect, the sensor system further comprises an element configured to transmit and/or guide at least a part of the EM signal into the vapor cell.

For example, the element is a waveguide or an antenna.

In an implementation form of the second aspect, the sensor system further comprises a heating element configured to heat the atoms in the vapor cell to a determined temperature.

In an implementation form of the second aspect, the at least one excitation source comprises two or more lasers which are configured to irradiate the vapor cell with light beams of different wavelengths and/or directions.

In an implementation form of the second aspect, the at least one excitation source further comprises an optical element which is configured to generate an array of light beams, wherein the light beams of the array of light beams are shifted in frequency and/or position.

In an implementation form of the second aspect, the at least one excitation source further comprises a detector configured to detect a fluorescence light emitted by the excited atoms in the vapor cell and/or an excitation signal of the at least one excitation source after transmitting through the vapor cell; wherein the processor is configured to determine the spectral information of the EM signal further based on a characteristic of the detected fluorescence light and/or the detected excitation signal.

In an implementation form of the second aspect, the vapor cell further contains a buffer gas which increases an ionization rate of the fraction of excited atoms in the vapor cell due to collisions of the atoms of the buffer gas with the excited atoms.

In an implementation form of the second aspect, the current sense circuit is configured to determine a current profile based on currents detected between a plurality of the number of electrode pairs along the vapor cell; wherein the processor is configured to determine the spectral information based on the current profile.

According to a third aspect, the present disclosure relates to method for analyzing a spectrum of an EM signal. The method comprises the steps of: exciting a number of the atoms in a vapor cell containing at least one species of atoms in a gaseous form to a Rydberg state, wherein at least a fraction of the excited atoms are ionized; generating a spatially and/or temporally varying electric and/or magnetic field in the vapor cell; exposing the vapor cell to the EM signal; and detecting a current between at least one of a number of electrode pairs which are arranged along the vapor cell, wherein the current is caused by ionized atoms in the vapor cell; and determining spectral information of the EM signal based on the detected current.

In an implementation form of the third aspect, the number of atoms in the vapor cell are excited to the Rydberg state by two or more laser beams.

In an implementation form of the third aspect, the method comprises the further step of: heating the atoms in the vapor cell to a determined temperature.

BRIEF DESCRIPTION OF THE DRAWINGS

The above-described aspects and implementation forms of the present disclosure will be explained in the following description of specific embodiments in relation to the enclosed drawings, in which.

DETAILED DESCRIPTIONS OF EMBODIMENTS

Figure 1:
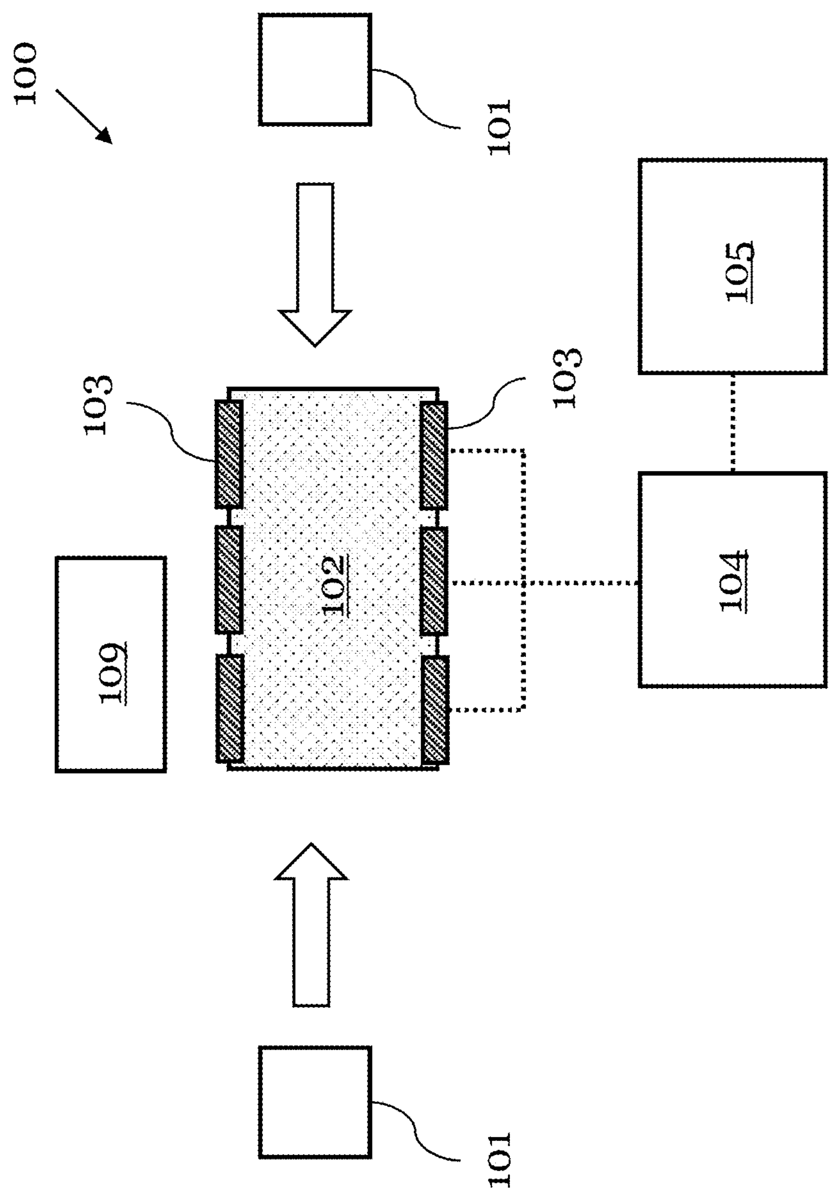
FIG. 1 shows a schematic diagram of a sensor system for analyzing a spectrum of an EM signal according to an embodiment.

FIG. 1 shows a schematic diagram of a sensor system 100 for analyzing an EM signal according to an embodiment.

The sensor system 100 comprises a vapor cell 102 containing at least one species of atoms in a gaseous form, wherein the atoms in the vapor cell are exposed to the EM signal; at least one excitation source 101 configured to excite a number of atoms in the vapor cell to a Rydberg state, wherein at least a fraction of the excited atoms are ionized; an electric and/or magnetic field generator 109 configured to generate a spatially and/or temporally varying electric and/or magnetic field in the vapor cell; a number of electrode pairs 103 which are arranged along the vapor cell 102, and which are configured to apply an electric field to the atoms in the vapor cell 102; a current sense circuit 104 configured to detect a current between at least one of the number of electrode pairs 103, wherein the current is caused by (at least some of the) ionized atoms in the vapor cell; and a processor 105 configured to determine spectral information of the EM signal based on the detected current.

The electrode pairs 103 of the sensor system 100 can be configured to generate the varying electric field in the vapor cell. The electric and/or magnetic field generator 109 can therefore comprise the electrode pairs 103 and/or can be configured to control the electrode pairs 103. For instance, the electric and/or magnetic field generator 109 can comprise a control circuit for controlling a voltage which is applied to each respective electrode pair 103.

The sensor system 100 can be a quantum sensor system, in particular a quantum broadband receiver.

The spectral information may comprise information on at least a part of the frequency spectrum of the EM signal.

The EM signal can be a radio frequency (RF) or a microwave (MW) signal. The EM signal can also be an optical signal.

The vapor cell 102 can be a gas cell which is filled with a gas formed by the atoms. For instance, the vapor cell has one or more transparent side surfaces which are at least partially transparent to excitation signals, e.g. light beams, which are generated by the at least one excitation source 101 to excite the atoms.

The sensor system 100 can comprise an element configured to transmit and/or guide at least a part of the EM signal into the vapor cell 102.

Figure 2:
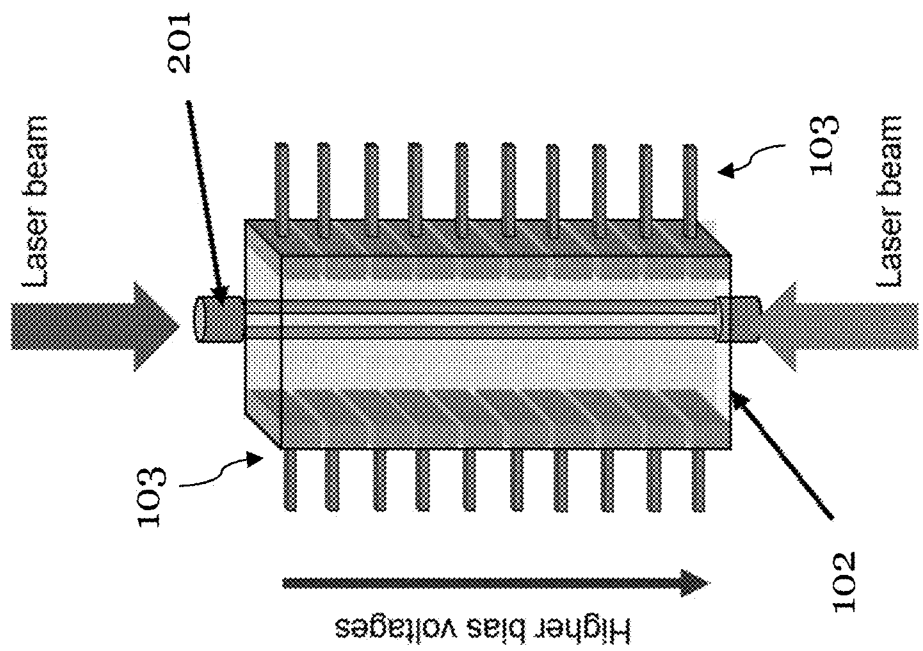
FIG. 2 shows a schematic diagram of a vapor cell of a sensor system according to an embodiment.

FIG. 2 shows a schematic diagram of the vapor cell 102 according to an embodiment. In this exemplary vapor cell 102, the element for guiding the EM signal is a waveguide 201 into which the EM signal is coupled. For instance, an evanescent field of the EM signal propagating through the waveguide can overlap with the atoms in the vapor cell 102 and interact with them. However, it is also possible to use other means to bringing the EM signal into the cell 102, such as an antenna, or to directly measure an ambient EM signal or a far-field of the EM signal in free space.

The at least one species of atoms in the vapor cell 102 can comprises Rubidium and/or Cesium atoms (or other atoms of a known type) which can be excited to a Rydberg state. Compared to ground state atoms, Rydberg atoms are generally more sensitive to EM radiation due to their strong electric-dipole coupling.

Figure 5B:
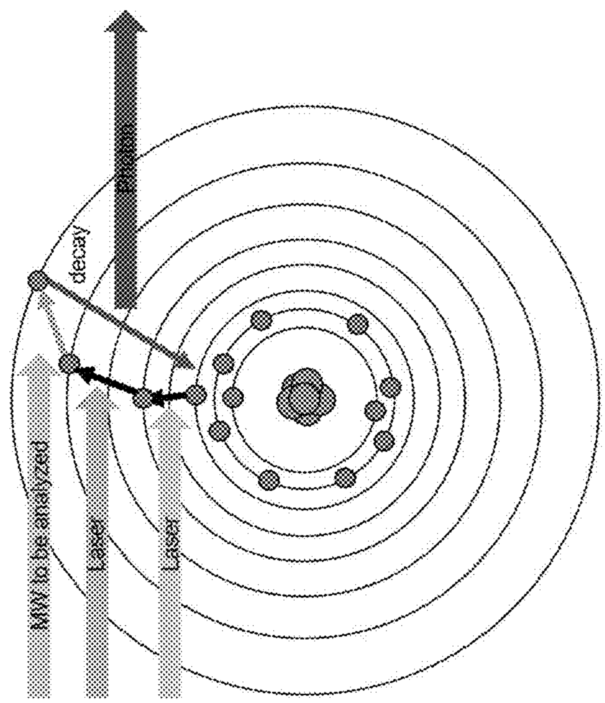
FIGS. 5A-5B show schematic diagrams of resonant excitations of an atom according to an embodiment.
Figure 5A:
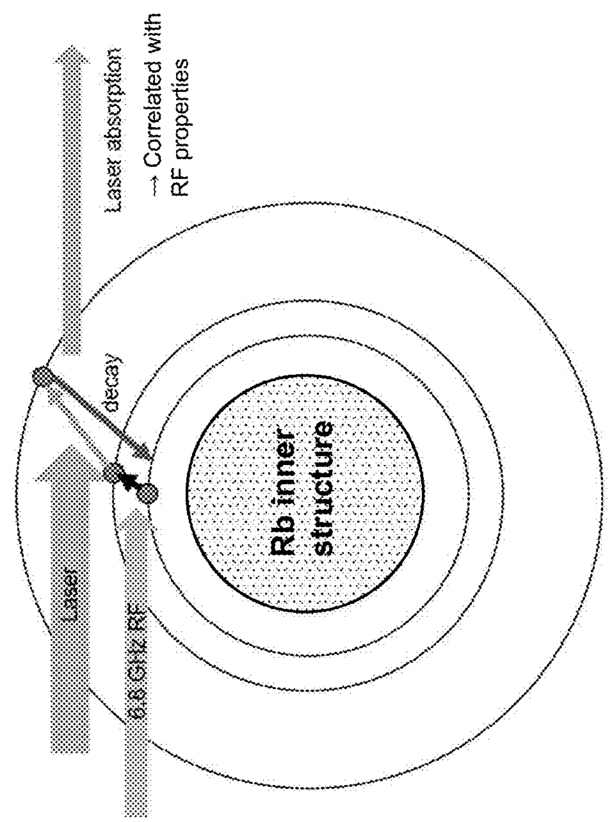

The excited atoms in the vapor cell 102 can form quantum sensing particles which can have one or multiple resonant frequencies in the MW or RF regime. This allows them to interact with the oscillating electromagnetic field of the EM signal at a particular frequency. This interaction can change the internal state of the atoms, modifying some of their properties. For example, during or after an interaction with a resonant EM field, the quantum particles may interact differently with light, e.g., changing an absorption coefficient of laser light at a certain wavelength. This can be detected with an optical detector. This general principle is schematically depicted in FIG. 5A.

The resonant frequency of the quantum sensing particles can be tuned or shifted by static electric and/or magnetic fields. For instance, Rubidium atoms have a resonant frequency at 6.8 GHz. However, in the presence of a static electric or magnetic field, Rubidium atoms may react to EM fields at a higher frequency. This allows "tuning" the particles to detect EM signal components at desired frequencies.

The sensor system 100 can use this effect to analyze the spectrum of an EM signal. By applying a locally varying electric or magnetic field (e.g., a static field gradient) to the gas volume in the vapor cell 102, the atoms in the cell 102 exhibit a position-dependent resonant frequency. This position-dependent resonant frequency can effectively implement a Fourier transform, because it maps frequency information to a spatial axis. For instance, the electric field gradient can be applied to the atoms in the vapor cell 102 by the number of electrode pairs 102. However, it is possible to achieve the same effect with a spatially varying magnetic field instead.

In the sensor system 100, two or more excitation signals (e.g., laser beams) can be used to excite the atoms in the vapor cell 102 to the Rydberg state. By using at least two excitation signals, an outer electron of the atoms can be excited to a shell with a large distance to the nucleus, as schematically depicted in FIG. 5B. This excitation is advantageous for EM sensing, as these "outer" shells offer a multitude of transitions in the MW regime, and are typically much more sensitive to EM radiation, because they interact with the electric part of the field (instead of the magnetic part, as is the case for NV diamonds and ground-state atoms) with a large interaction strength (because Rydberg states have a high electric dipole moment).

The at least one excitation source 101 can generate two or more excitation signals which are irradiated in the vapor cell 102 for exciting the atoms. For instance, the at least one excitation source 101 comprises two or more lasers which are configured to irradiate the atoms in the vapor cell 102 with light beams of different wavelengths. The two or more lasers can be arranged such that their emitted laser light is counter-propagating (e.g., to cancel a Doppler effect). The least one excitation source 101 can be a frequency selective excitation source which is adapted to excite atoms in the vapor cell to a first Rydberg state.

The sensor system 100 comprises a number of electrode pairs 103 which are arranged along the vapor cell 102, as can also be seen in FIG. 2. The electrode pairs 103 can at least partially be arranged inside the vapor cell 102 (in-cell electrodes), such that they can directly detect the ionization of Rydberg atoms in the cell.

A static electric voltage can be applied to each of the electrode pairs 103, e.g. by the current sense circuit 104, resulting in static electric fields in the vapor cell which can shift resonant frequencies of the atoms in the vapor cell 102. Thereby, a different bias voltage can be applied to each pair of electrodes 103 to generate an electric field gradient along a direction of the vapor cell 102. For instance, a pair consists of one electrode on opposite sides of the vapor cell 102.

Furthermore, the electrode pairs 103 can be used to detect successful Rydberg excitations. Atoms that are excited to a Rydberg level are often ionized by collisions with other atoms in the vapor cell 102. The electric field applied to the electrode pairs 103 can accelerate the charged components of the ionized atoms (i.e., the negatively charged electron and the positively charged ion) towards the electrodes. This causes the current that can be detected by the current sense circuit 104.

The current sense circuit 104 can be configured to measure a current between the electrodes of each electrode pair 103, and/or to apply a static voltage to each electrode pair 103 (where the voltage may be different for each pair). The current sense circuit 104 can comprise a current amplifier which is electrically connected to the electrodes 103.

The processor 105 can be electrically connected to the current sense circuit 104 and can be configured to receive the sensed current or a signal with is representative of the detected current. The processor 105 can be a microprocessor or a controller.

In this way, the sensor system 100 can monitor the spectrum of the EM signal (or a part thereof) in real-time.

To excite atoms in the vapor cell 102 to a resonant (Rydberg) state, the two lasers 101 can be adjusted so that they are resonant with one particular transition to a first Rydberg state or level. For instance, if no EM signal (e.g., RF/MW field) to be analyzed is present, the lasers 101 can excite some atoms to the first Rydberg state. The thus excited Rydberg atoms travel a short distance until they collide with another atom in the vapor cell 102 leading to an ionization of the Rydberg atoms, which can be detected by a current between certain electrode pairs. The travel distance typically depends on a pressure inside the cell. To detect more charges, the collision rate can be increased by increasing the pressure in the cell (e.g., via a temperature increase).

The vapor cell 102 can also contain a buffer gas which facilitates increasing an ionization rate of atoms in the vapor cell 102 due to collisions of the atoms of the buffer gas with the excited atoms.

If the EM signal is (near-) resonant to a transition between the first Rydberg state and a second Rydberg state of an atom in the vapor cell 102, it changes the energy level structure of the atom, i.e., it moves the first Rydberg state out of the resonance with the excitation laser beams, reducing the Rydberg excitation probability in a particular region in the cell. This can be detected by the current sense circuit 104 as a reduction of a current between a particular pair of electrodes 103.

Thus, an EM signal which is near-resonant to a first-to-second Rydberg state transition, may prevent an excitation by the excitation signal, causing a dip in the current measured at a respective electrode pair 103. Hence, local dips in current may indicate the presence of a resonant EM signal of a certain frequency. The strength of the dip may be correlated with an intensity of the EM signal at said frequency.

In particular, the EM signal can interact with the atoms, driving transitions between the first Rydberg state and a second Rydberg state and/or shifting the energy levels of the Rydberg states. This has an effect on the Rydberg excitation probability from the laser beams, and may thus be detected via the ionization current between certain electrode pairs.

For instance, the current sense circuit 104 can be configured to determine a current profile along the vapor cell based on different currents detected at different locations in the vapor cell 102. The processor 105 can correlate this current profile with the known electric field gradient (i.e., the different electric fields at the respective locations of the vapor cell) to determine spectral information of the EM signal. The spectral information may comprise a signal strength at different frequencies of the EM signal.

For example, the bandwidth of a quantum sensor 100, as shown in FIG. 1, depends on the electric field gradient along the vapor cell 102. In principle, a higher gradient leads to a stronger shift of the resonant frequency along the cell. However, in general, the field shifts both the first and the second Rydberg state, which means that the excitation signals will eventually no longer be resonant. For the Rydberg excitation to work reliably, the excitation signals should preferably be in a ~5 MHz region around the resonance.

Thus, in order to reach a high bandwidth, a first Rydberg state whose resonant frequency does not change significantly in an electric field, and a second Rydberg state that changes strongly in the electric field should be chosen.

Figure 6A:
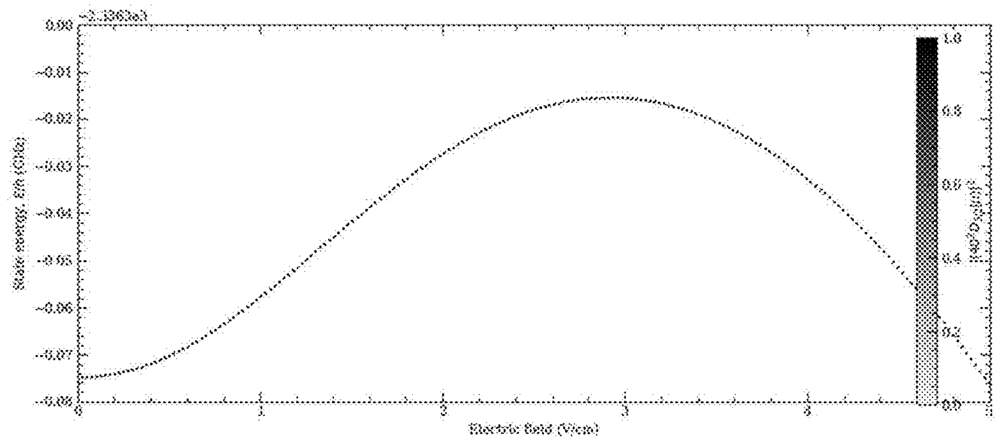
FIGS. 6A-6C show resonant energies of different Rydberg states as a function of an applied electric field according to an embodiment.
Figure 6B:
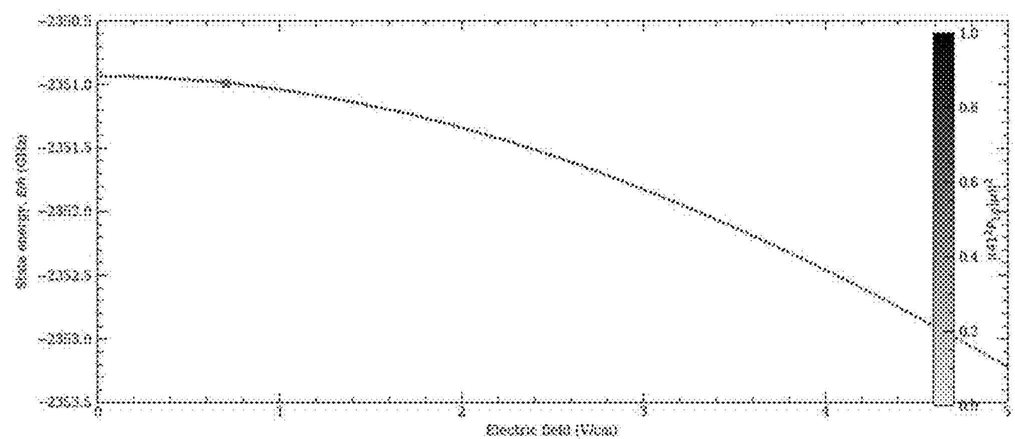
Figure 6C:
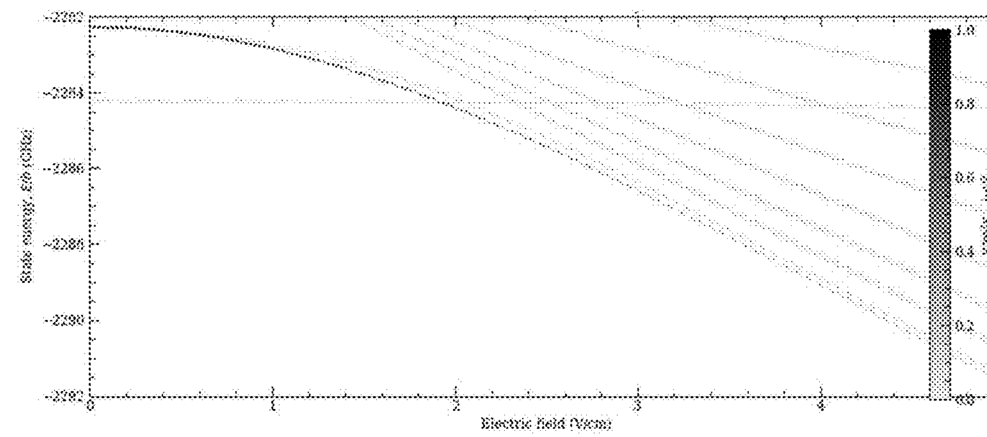

FIGS. 6A-6C show resonant energies of different Rydberg states as a function of the applied electric field according to an embodiment. Hereby, the resonant energy refers to the energy required to excite an atom to the Rydberg state. The state energies in these plots are given relative to the ionization threshold, i.e. an energy of 0 means that the electron is no longer bound to the atom.

For instance, a good choice for the first Rydberg state is the nD3/2 state in Cesium. When applying an electric field, this state features a local maximum in the energy dependency (example for n=40), which is shown in FIG. 6A. Around the local maximum, the energy of the state is relatively insensitive to the electric field.

The possible second Rydberg states in Cesium have a stronger field dependency; for instance, the 41P1/2 state, which is shown in FIG. 6B as a function of the applied electric field. In the electric field in the range of about 2.4 V/cm and 3.4 V/cm, where the first state (FIG. 6A) varies by only 5 MHz, this state varies by about 600 MHz. Thus, when using this state for EM sensing, a real-time bandwidth of 600 MHz can be reached with a single vapor cell 102 and a single pair of excitation signals (e.g., laser beams).

Another possible target state is the 38F5/2 state, which is shown in FIG. 6C as a function of the applied electric field. This state shows a variation of about 2 GHz, but suffers from reduced transition strengths at these fields and multiple nearby lines.

Figure 3:
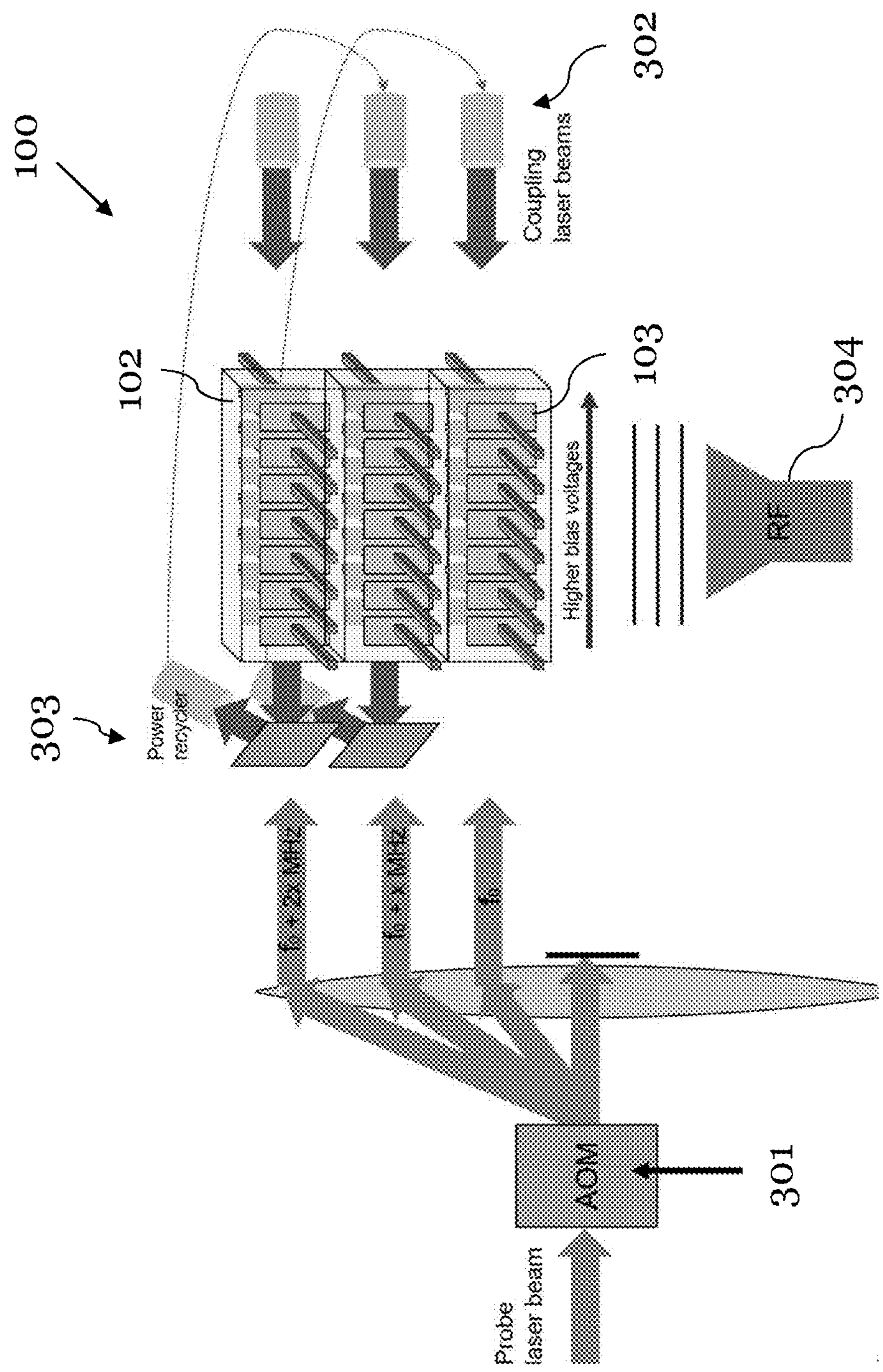
FIG. 3 shows a schematic diagram of a sensor system for analyzing a spectrum of an EM signal according to an embodiment.

FIG. 3 shows a schematic diagram of the sensor system 100 for analyzing the spectrum of the EM signal according to an embodiment. (The current sense circuit 104 and processor 105 are not depicted in FIG. 3.)

The exemplary sensor system 100 shown in FIG. 3 comprises an antenna 304, e.g. a horn antenna, to transmit the EM signal to be analyzed into the vapor cell 102.

Furthermore, the excitation source 101 may comprise an optical element 301 which is configured to generate an array of light beams, each shifted in frequency by a few MHz. Each light beam may further be shifted in position to interact with a different region of the vapor cell 102.

For instance, the optical element 301 can be an acousto-optic modulator (AOM) which is configured to generate an array of light beams, each shifted in frequency by a few MHZ (e.g. by 5 MHZ). For instance, the optical element 301 in the form of the AOM receives an input RF signal. Multiple beams separated by e.g. 5 MHz can be created if a multicarrier RF signal is fed to the AOM.

The various light beams (also referred to as probe or coupling laser beams) can be coupled into the vapor cell 102 by a number of coupling units 302 (e.g., fiber couplers). Instead, one could also use one large coupling beam to illuminate the entire cell. Optionally, the transmitted light beams can be received by power recycler units 303 such that their power can be reused.

The electrode pairs 103 can be arranged in the form of a 2D array on two opposite sides of the vapor cell 102. The coupling units 302 can be configured to transmit each respective light beam (with a certain frequency) along one line of the 2D electrode pair 103 array, such that each line of the 2D array detects resonances which are excited with an excitation signal at a different frequency.

In this way, the bandwidth of a sensor system 100 with a single large vapor cell 102 can be drastically increased. The light beams can be kept resonant to the first Rydberg state by only shifting them for a few MHz.

Alternatively, separate vapor cells could be used for each individual light beam.

Figure 4:
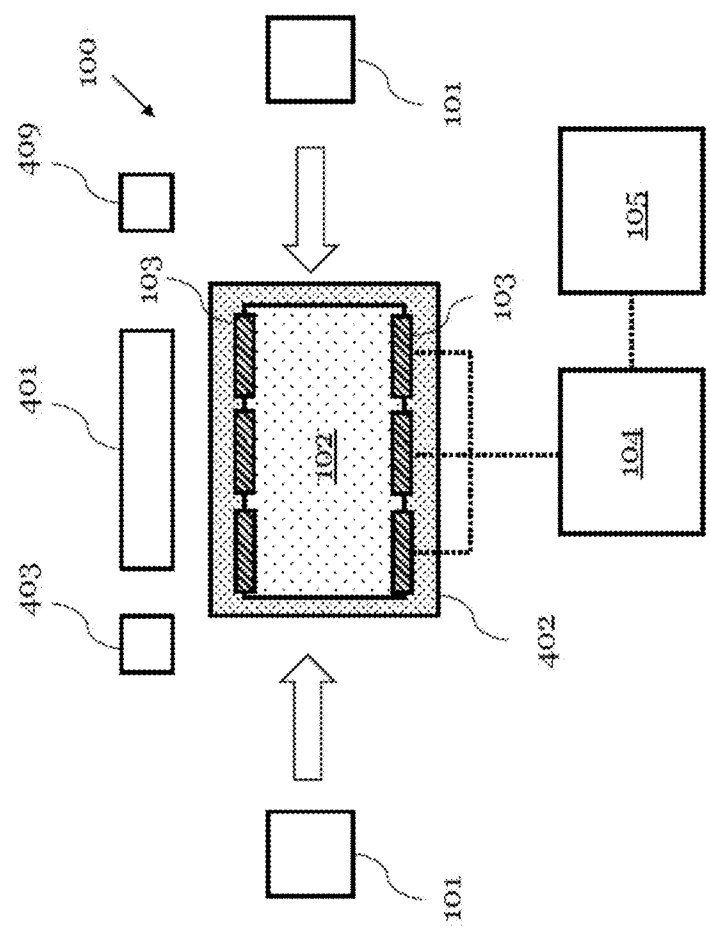
FIG. 4 shows a schematic diagram of a sensor system for analyzing a spectrum of an EM signal according to an embodiment.

FIG. 4 shows a schematic diagram of the sensor system 100 for analyzing the spectrum of the EM signal according to a further embodiment. The system 100 shown in FIG. 4 can comprise the same basic components as the system in FIG. 1, e.g., the excitation source(s) 101, the vapor cell 102, the electrode pairs 103, the current sense circuit 104 and the processor 105.

The sensor system 100 in FIG. 4 further comprises an optional heating element 402 configured to heat the atoms in the vapor cell to a determined temperature. The temperature can be used to control the number of atoms available for Rydberg excitation. Furthermore, the temperature can be used to control the energy levels, e.g. to a stable level, and/or the atomic collision rate in the vapor cell 102 (and, thus influence the ionization rate and the current which is measured).

The sensor system 100 can further comprise a detector 403, e.g. a camera, configured to detect a fluorescence light emitted by the excited atoms in the vapor cell 102 and/or an excitation signal, which was emitted by the at least one excitation source 101, after transmitting through the vapor cell. In this case, the processor 105 can be configured to determine the spectral information of the EM signal further based on a characteristic of the detected fluorescence light and/or the detected excitation signal.

In this way, the readout of the Rydberg excitation via the current between the electrode pairs 103 can be combined with a fluorescence readout and/or a detection of a transmission of the laser beam(s) to receive more information on the EM signal. For instance, the measurements of the detector 403 can be used to cross-check the results of the current measurements, as the detector can probe a different property of the atoms. For instance, the measurement can be used to infer a current number of atoms which are in a Rydberg state. The transmission of the excitation signal can indicate a rate in which resonant transitions occur or a coherence of the transitions in the vapor cell 102. From the result of both measurements (induced current and transmission/fluorescence), properties of the EM signal can be inferred.

In addition or alternatively, the sensor system 100 can comprise a magnetic field generator 401 configured to generate a spatially and/or temporally varying magnetic field in the vapor cell 102. For instance, the magnetic field generator 401 comprises one or more magnets (or coils) near the vapor cell 102, e.g. arranged along the vapor cell 102. The magnetic field generator 401 can generate a magnetic field gradient in the vapor cell 102.

Same as the applied electric field, a static magnetic field can shift the energy levels of the first and/or the second Rydberg state, leading to position-dependent resonant frequencies of the atoms in the vapor cell 102.

For example, both an electric field gradient (via the electrode pairs 103) and a magnetic field gradient (via the magnetic field generator 401) could be applied to the atoms in the vapor cell 102.

However, alternatively it is also possible, to only vary the magnetic field in the vapor cell 102 while the electric field generated by the electrode pairs 103 is uniform throughout the vapor cell (and is only used for readout).

Using a magnetic field gradient to locally shift resonant frequencies of atoms can be more challenging, because the magnetic field may cause a splitting of the magnetic sub levels of all states, including the ground state and the intermediate state for Rydberg excitation, which results in a large number of lines in the laser excitation spectrum.

Nevertheless, there are two-photon resonances from the ground to a first Rydberg state in Rubidium and Cesium that feature a local minimum in the transition frequency for varying magnetic field strengths. This happens for Rydberg states with a magnetic quantum number $mj<0$, where the paramagnetic Zeeman effect leads to a negative linear energy shift and the diamagnetic Zeeman effect to a positive quadratic energy shift.

Alternatively, $mj=0$ states in molecules could be used that do not experience energy shifts in static electric/magnetic fields.

As an alternative to an electric and/or magnetic field generator 109, 401, the sensor system 100 may comprise a signal generator 409 which is configured to generate a microwave (MW) signal with a spatially and/or temporarily varying intensity in the vapor cell 102. The signal generator 409 may comprise an antenna for transmitting the microwave signal in the direction of the vapor cell 102.

The microwave signal (or microwave field) which is generated by the signal generator 409 can also be used for position dependent frequency tuning, in particular of the second Rydberg state. The microwave signal is thereby generated to be resonant to a transition between the second and an additional third Rydberg state. Thereby, the frequency shift depends on the power and the frequency of the additional microwave signal. Thus, to achieve frequency tuning, it is possible to add a microwave signal with an intensity gradient along the cell 102, or to do a temporal sweep of microwave power or frequency.

Applying the (varying) microwave signal could also be combined with applying a varying electric and/or magnetic field to the vapor cell 102.

Figure 7:
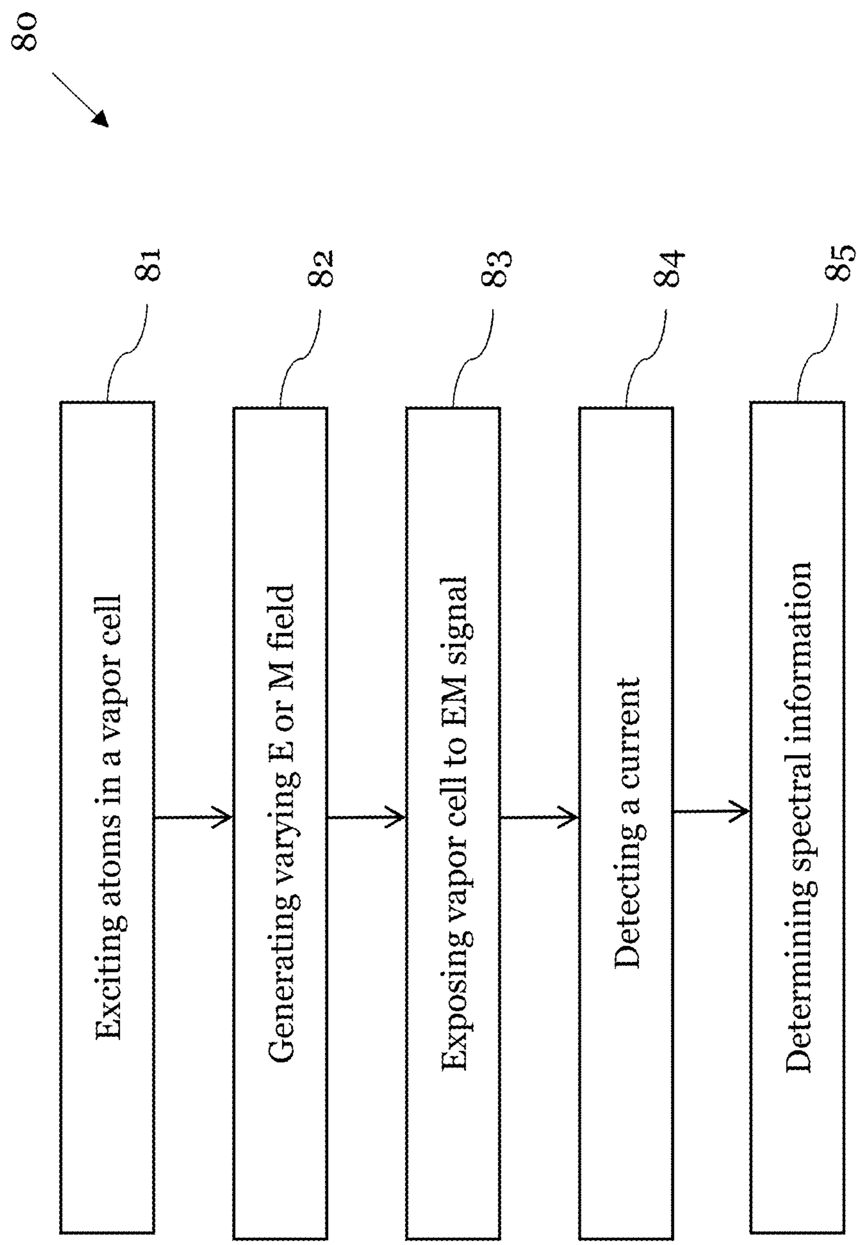
FIG. 7 shows a flow chart of a method for analyzing a spectrum of an EM signal according to an embodiment.

FIG. 7 shows a flow chart of a method 80 for analyzing the spectrum of the EM signal according to an embodiment. For example, the method 80 can be carried out by any one of the sensor systems 100 shown in FIGS. 1-4.

The method 80 comprises the steps of: exciting 81 a number of the atoms in the vapor cell 102, which contains the at least one species of atoms in a gaseous form, to the Rydberg state, wherein at least a fraction of the excited atoms are ionized; generating 82 a spatially and/or temporally varying electric and/or magnetic field in the vapor cell 102; exposing 83 the vapor cell 102 to the EM signal; detecting 84 the current between at least one of a number of electrode pairs 103 which are arranged along the vapor cell 102, wherein the current is caused by the ionized atoms in the vapor cell 102; and determining 85 the spectral information of the EM signal based on the detected current.

The steps of the method 80, in particular steps 81-83, can be carried out in any order and overlapping in time.

The vapor cell 203 (and the atoms therein) can be exposed 81 to the EM signal by transmitting and/or guiding the EM signal into the vapor cell 102. The number of atoms in the vapor cell 102 can be excited to the Rydberg state by two or more laser beams.

The method 80 may comprise the further step of heating the atoms in the vapor cell to a determined temperature.

All features described above or features shown in the figures can be combined with each other in any advantageous manner within the scope of the disclosure.

The invention claimed is:

1. A sensor system for analyzing a spectrum of an electromagnetic, EM, signal, comprising:

a vapor cell containing at least one species of atoms in a gaseous form, wherein the atoms in the vapor cell are exposed to the EM signal;

at least one excitation source configured to excite a number of atoms in the vapor cell to a Rydberg state, wherein at least a fraction of the excited atoms are ionized;

an electric and/or magnetic field generator configured to generate a spatially varying electric and/or magnetic field in the vapor cell;

a number of electrode pairs which are arranged along the vapor cell, and which are configured to apply an electric field to the atoms in the vapor cell;

a current sense circuit configured to detect a current between at least one of the number of electrode pairs, wherein the current is caused by ionized atoms in the vapor cell; and a processor configured to determine spectral information of the EM signal based on the detected current.

2. The sensor system of claim 1, wherein the electric and/or magnetic field generator is configured to control the number of electrode pairs to generate a spatially varying electric field in the vapor cell.

3. The sensor system of claim 1, further comprising:

an element configured to transmit and/or guide at least a part of the EM signal into the vapor cell.

4. The sensor system of claim 3, wherein the element is a waveguide or an antenna.

5. The sensor system of claim 1, further comprising:

a heating element configured to heat the atoms in the vapor cell to a determined temperature.

6. The sensor system of claim 1, wherein the at least one excitation source comprises two or more lasers which are configured to irradiate the vapor cell with light beams of different wavelengths and/or directions.

7. The sensor system of claim 1, wherein the at least one excitation source comprises an optical element which is configured to generate an array of light beams, wherein the light beams of the array of light beams are shifted in frequency and/or position.

8. The sensor system of claim 1, further comprising:

a detector configured to detect a fluorescence light emitted by the excited atoms in the vapor cell and/or an excitation signal of the at least one excitation source after transmitting through the vapor cell;

wherein the processor is configured to determine the spectral information of the EM signal further based on a characteristic of the detected fluorescence light and/or the detected excitation signal.

9. The sensor system of claim 1, wherein the vapor cell further contains a buffer gas which increases an ionization rate of the fraction of excited atoms in the vapor cell due to collisions of the atoms of the buffer gas with the excited atoms.

10. The sensor system of claim 1, wherein the current sense circuit is configured to determine a current profile based on currents detected between a plurality of the number of electrode pairs along the vapor cell;

wherein the processor is configured to determine the spectral information based on the current profile.

11. The sensor system of claim 1, wherein the number of electrode pairs are configured to apply a uniform electric field to the atoms in the vapor cell.

12. A sensor system for analyzing a spectrum of an electromagnetic, EM, signal, comprising:

a vapor cell containing at least one species of atoms in a gaseous form, wherein the atoms in the vapor cell are exposed to the EM signal;

at least one excitation source configured to excite a number of atoms in the vapor cell to a Rydberg state, wherein at least a fraction of the excited atoms are ionized;

a signal generator configured to generate a microwave signal with a spatially varying signal strength and/or frequency in the vapor cell;

a number of electrode pairs which are arranged along the vapor cell, and which are configured to apply an electric field to the atoms in the vapor cell;

a current sense circuit configured to detect a current between at least one of the number of electrode pairs, wherein the current is caused by ionized atoms in the vapor cell; and a processor configured to determine spectral information of the EM signal based on the detected current.

13. A method for analyzing a spectrum of an electromagnetic, EM, signal, comprising:

exciting a number of atoms in a vapor cell containing at least one species of atoms in a gaseous form to a Rydberg state, wherein at least a fraction of the excited atoms are ionized;

generating a spatially varying electric and/or magnetic field in the vapor cell;

exposing the vapor cell to the EM signal;

detecting a current between at least one of a number of electrode pairs which are arranged along the vapor cell, wherein the current is caused by ionized atoms in the vapor cell; and determining spectral information of the EM signal based on the detected current.

14. The method of claim 13, wherein the number of atoms in the vapor cell are excited to the Rydberg state by two or more laser beams.

15. The method of claim 13, further comprising:

heating the atoms in the vapor cell to a determined temperature.

* * * * *